a2

Steps 1, 2

Steps 3

Steps 4

Steps 5, 6

Steps 7

Steps 8, 9

Steps 10

FIG. 10(g,h)

LIGHT EMITTING MESA STRUCTURES WITH HIGH ASPECT RATIO AND NEAR-PARABOLIC SIDEWALLS

This is a continuation of PCT/IE2004/000063 filed 4 May 2004 and published in English.

INTRODUCTION

1. Field of the Invention

The invention relates to light emitting diodes (LEDs) and photodiodes (PDs).

2. Prior Art Discussion

LEDs convert electrical energy into optical energy, and PDs convert optical energy into electrical energy. We will describe the invention as it relates to LEDs, and it will be readily understood that the invention can also be applied to the reverse, PD, operation.

In semiconductor LEDs, light is usually generated through recombination of electrons, originating from an n-type doped semiconductor layer, and holes originating from a p-type doped semiconductor layer. In some infra-red emitting semiconductor materials light can be generated by electron inter-sub-band transitions rather than electron hole transitions. We will call the area where the main light generation takes place the light-emitting layer (LEL).

A major challenge is to extract as much of the emitted light as possible from the semiconductor material into the surrounding medium, usually air. This is hindered by total internal reflection at the surfaces of the semiconductor.

On traditional cuboid shaped LED chips, the average path length for light rays within the semiconductor is long, and the average number of reflections of an emitted light ray at semiconductor surfaces is high, prior to escape. Long path lengths and reflections at metal coated semiconductor surfaces both lead to absorption losses. The light that does escape, escapes to a large extent through the sides of the chip and an external mirror is needed to collect this light into a useful light beam. Another approach is called chip shaping. Higher extraction efficiencies (EEs) are possible with this approach. However, it does not eliminate the long path lengths within the semiconductor chip, nor the requirement for an external mirror. Also, the technique is less suitable to the widely used gallium nitride (GaN) based materials systems. The reason for this is that the sapphire and silicon carbide (SiC) substrates commonly used in GaN-based LED-chips are both very hard materials and very difficult to shape mechanically, for example with a dicing saw. In these materials systems it seems not to be a practical solution to shape the whole chip.

Another approach to achieving a high EE is to provide an array of "micro LEDs", thus keeping the average path length within the device short. Such arrangements are described in U.S. Pat. No. 06,410,940 and U.S. Pat. No. 6,410,942.

However, there is substantial scope for improving the EE, and also the directionality of the emerging light beam. An improved method to manufacture the structures is also required. These are the objectives of the present invention.

SUMMARY OF THE INVENTION

According to the invention, there is provided an optical device comprising a semiconductor diode having an active layer enclosed in a semiconductor structure mesa, in which:

the mesa has a truncated top, on a side opposed to a light transmitting or receiving face;

the mesa has an aspect ratio $((H3) \times (H3)/A_c)$ greater than 0.5, in which $A_c$ is the cross-sectional area at the level of the active layer and H3 is height of the mesa; and side walls of the mesa intersect the active layer at an angle $\alpha = 45°$ (+/−20°) along a substantial part of the active layer perimeter, whereby the mesa has a near-parabolic shape to form a reflective enclosure for light generated or detected within the device.

In one embodiment, the mesa cross sectional area ($A_c$) at the level of the active layer is less than 100 µm²;

In one embodiment, the mesa has an aspect ratio $((H3) \times (H3)/A_c)$ greater than 3.

In one embodiment, the mesa has an aspect ratio $((H3) \times (H3)/A_c)$ greater than 8.

In one embodiment, the mesa further comprises an electrical contact on the truncated top.

In one embodiment, the electrical contact occupies less than 16% of the area of the truncated top.

In one embodiment, the mesa side walls are curved, the side wall angle $\alpha$ increasing continuously from the active layer towards the transmitting or receiving face.

In one embodiment, the cross sectional area ($A_c$) of the mesa is rectangular in shape, the length being more than twice the width.

In another embodiment, the active layer is of InGaN material.

In one embodiment, the active layer is of InGaAs material.

In one embodiment, the active layer is of InGaAsP material.

In one embodiment, the active layer is of ZnCdSeTe material.

In a further embodiment, the height (H3) of the mesa is greater than 5 µm.

In one embodiment, the active layer is an emitting layer whereby the device is an LED.

In one embodiment, the active layer is a detecting layer, whereby the device is a photodiode.

In one embodiment, the device comprises an array of diodes.

In one embodiment, the array comprises conductors so that individual diodes or diode clusters are individually addressable, thus forming an addressable LED or PD array.

In one embodiment, the device area covered with diode mesas is greater than 10 mm², and wherein more than 80% of all extracted light is extracted through a back surface, whereby the device is scalable and suitable for high light outputs from a single array-chip.

In one embodiment, the area covered with diode mesas is greater than 100 mm².

In one embodiment, the array is configured as a flip-clip, mounted on a heat sink.

The invention also provides a method of fabricating a diode array as defined above, wherein a single lithography step is followed by the following three processing steps, without additional lithography:

etching of the semiconductor mesa, application of an insulating mesa side-wall coating, and deposition of the electrical contact to the top of the mesa.

In one embodiment, the etch mask for the semiconductor mesa etch comprises a multi-layer of more than one layer, and one or more layers are etched selectively after the mesa etch step to create an overhang profile, suitable for pattern definition through lift-off of a subsequent coating.

In one embodiment, the etch mask is re-flowed prior to etching to provide a desired sidewall profile for the semiconductor mesa.

In one embodiment, the multi-layer etch mask consists of a double-level resist.

In one embodiment, the method comprises an additional oxygen plasma step to reduce the D1/D2 ratio.

In one embodiment, the step of applying a top electrical contact that has greater than 80% reflectivity at the emission wavelength, said reflectivity being as measured at the semiconductor-to-contact interface and at the normal incidence.

In one embodiment, the electrical contact and the flip-chip bonding metallisation are all deposited in one step, without additional lithography.

DETAILED DESCRIPTON OF THE INVENTION

Brief Description of the Drawings

The invention will be more clearly understood from the following description of some embodiments thereof, given by way of example only with reference to the accompanying drawings in which:—

FIGS. 10(a) to 10(h) are a sequence of diagrams showing steps of a production process for producing a device of the invention, FIGS. 10(g) and 10(h) showing a diagram of a cluster of micro-LEDs both in cross-section and in plan view;

DESCRIPTION OF THE EMBODIMENTS

The invention provides an optical device consisting of one or an array of highly efficient micro-LEDs, and a manufacturing process. Each micro-LED is an integrated diode structure in a mesa shape, in which the mesa shape and the light-emitting region are chosen for optimum efficiency. The following description refers to a device having an array of elements, and the elements are light emitting diodes rather than photodiodes.

Figure 1:
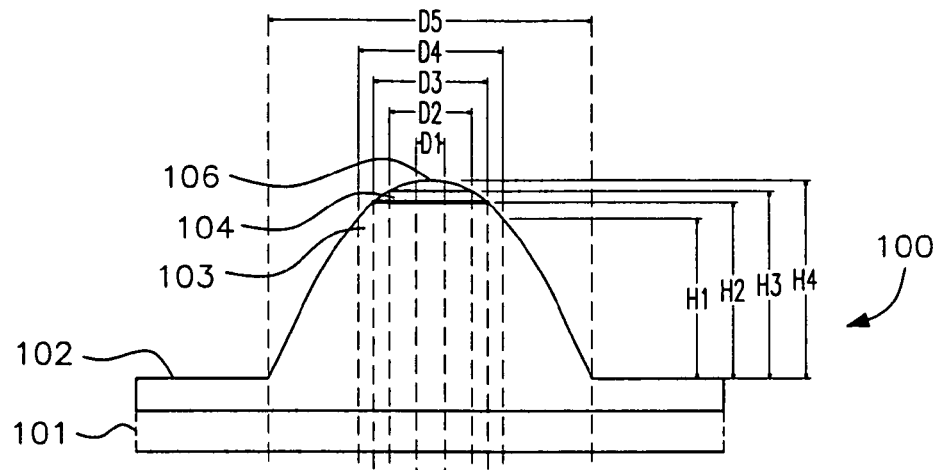
FIG. 1 is a diagrammatic cross sectional view of a single element of a micro LED array device.
Figure 2:
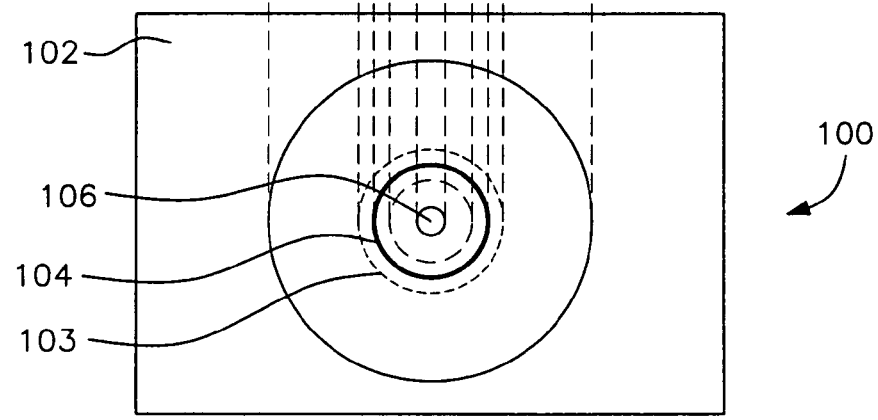
FIG. 2 is a plan view.

Referring to FIGS. 1 and 2 a single one of the micro-LEDs 100 comprises, on a substrate 101 and a semiconductor layer 102, a mesa 103, a light emitting layer 104, and an electrical contact 106. The micro-LEDs in this device have a very high EE because of their shape. Light is generated within the mesa, which is shaped to enhance the escape probability of the light. Very high EEs are achieved, particularly with a near-parabolic mesa that has a high aspect ratio. The top of the mesa is truncated above the light-emitting layer (LEL), providing a flat surface for the electrical contact 106 on the top of the semiconductor mesa. It has been found that the EE is high provided the top contact has a good reflectivity value. Also, it has been found that efficiency is particularly high if the contact 106 occupies an area of less than 16% of the truncated top mesa surface area. This feature also helps to achieve a more directional beam in the case of the device being an LED.

Figure 5:
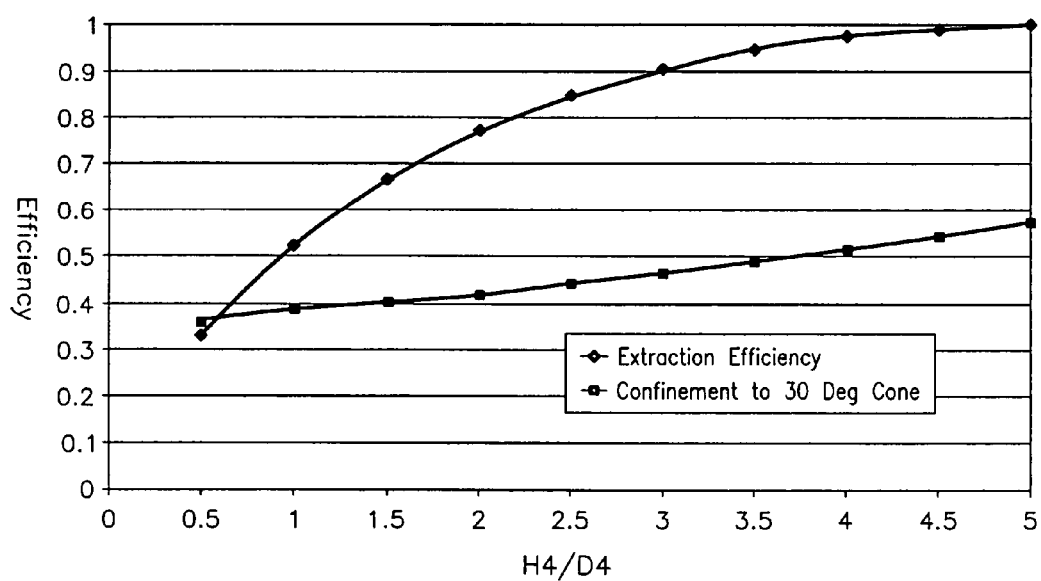
FIG. 5 is a plot of extraction efficiency into air versus aspect ratio (H4/D4) for paraboloid shaped reflectors in semiconductor material with a refractive index of 2.28.
Figure 6:
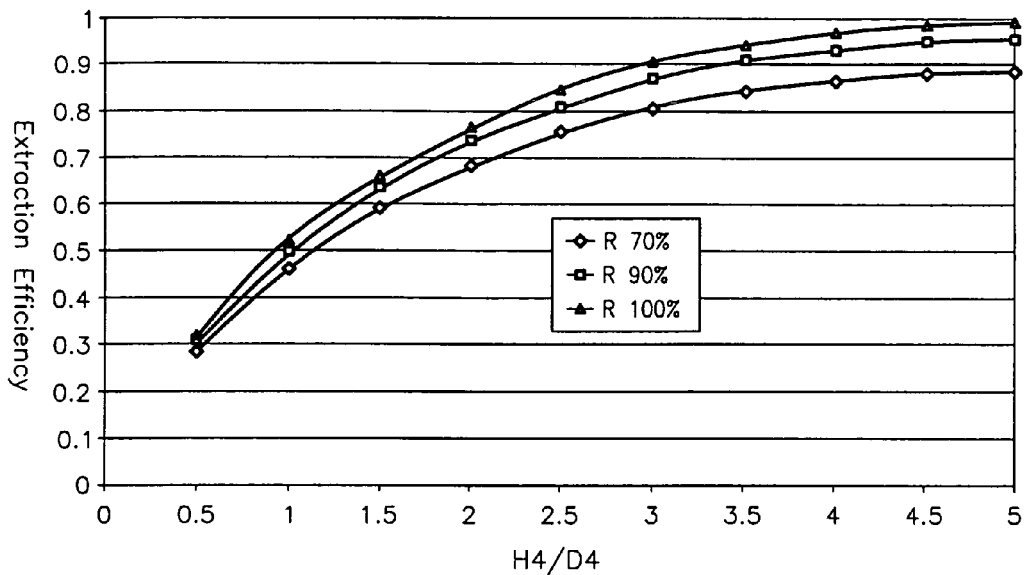
FIG. 6 shows the effect of the top electrical contact reflectivity on the results obtained in FIG. 5.

Having a high aspect ratio is effective, as is clear from FIGS. 5 and 6. It is preferably greater than 0.5, and more preferably greater than 3, and most preferably greater than 8. The aspect ratio is calculated variously based on H3/D4, H4/D4, and $((H3) \times (H3)/A_c)$. The former two are used for modelling purposes, and the latter as a measurable one based on measurable dimensions in the physical device. In fact, all three definitions yield very similar results.

In one embodiment the light is generated in GaN based micro-LEDs, and the light is efficiently emitted through a sapphire substrate. The shape of the micro-LEDs also allows the light from each micro-LED to be very directional, which is an advantage in many applications, such as light coupling to fibres or waveguides. While in this example visible light emission was used, the invention holds also for LEDs emitting in the invisible part of the spectrum, i.e. in the ultra-violet or infrared. And while in this example a transparent sapphire substrate was used, the invention would remain valid if there were no separate substrate present.

Figure 3:
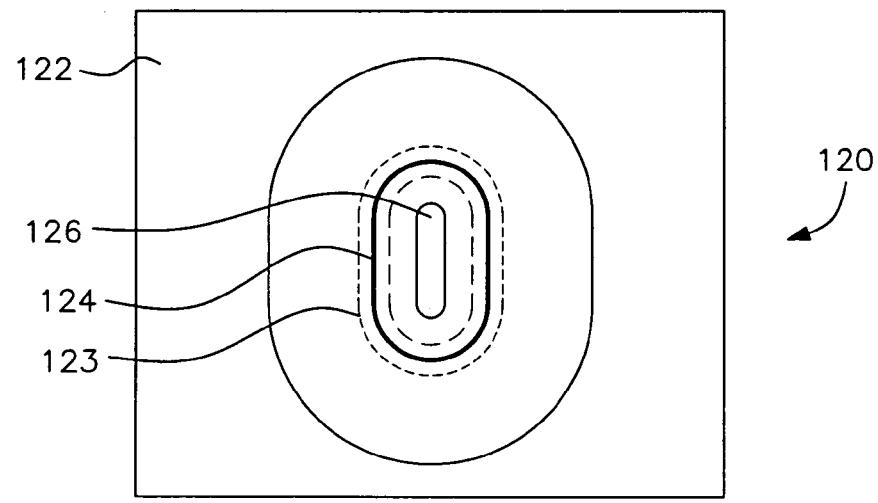
FIG. 3 is a plan view of an alternative device.

Referring to FIGS. 1 and 2 a micro-LED 1 of the array comprises regions as follows:

D1: top electrical contact diameter,
D2: top of truncated semiconductor mesa diameter,
D3: LEL diameter,
D4: diameter of the focal plane of a paraboloid (the focal plane being the horizontal plane that intersects the focal point), and
D5: base of the semiconductor mesa diameter.
H1: Height of paraboloid focal plane above the base of the mesa,
H2: Height of LEL layer above the base of the mesa,
H3: Height of truncated top above the base of the mesa, and
H4: Height of paraboloid top above the base of the mesa.
$A_c$: Cross-sectional area of the mesa at the level of the LEL The shape of each micro-LED may be "stretched" in one direction, as shown in FIG. 3, depending on the application. In this embodiment, a device 120 has a semiconductor layer 122, a mesa 123, a light emitting layer 124, and a contact 126.

In general, the array has the following properties:
mesa cross sectional area ($A_c$) at the level of the active layer is less than 100 μm$^2$;
at least some mesas have an aspect ratio $((H3) \times (H3)/A_c)$ greater than 0.3; and
the side-walls of the diode mesas intersect the active layer at an angle α=45° (+/−20°), along most (i.e. >50%) of the active layer perimeter.

Figure 4:
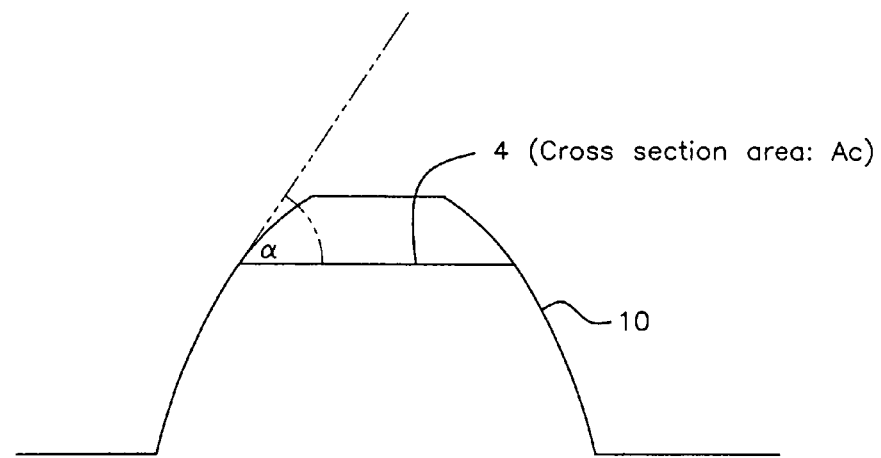
FIG. 4 defines the angle α between the light emitting layer (LEL) and the mesa sidewall.

FIG. 4 is a diagram defining the angle α between the LEL and the mesa sidewall.

FIG. 5 shows the calculated extraction efficiency as a function of the aspect ratio H4/D4 of a paraboloid shaped device. For high aspect ratios, and high top contact reflectivities, the calculated extraction efficiency approaches 100%. This is much higher than on most presently available commercial LEDs. The best commercial GaN based LEDs have extraction efficiencies of about 45%. In FIG. 5 D1=D2, H1=H2, D3/D2=1.12, and R=100% at the top electrical contact. In this calculation all reflections from the side surfaces were assumed to be 100% reflective and the rays that hit the bottom semiconductor to air interface within the critical angle were 100% transmitted, while rays hitting this interface outside the critical angle were considered as lost. FIG. 5 also shows the portion of light emerging into air that is confined to a 30° cone (for the same paraboloids).

Figure 7:
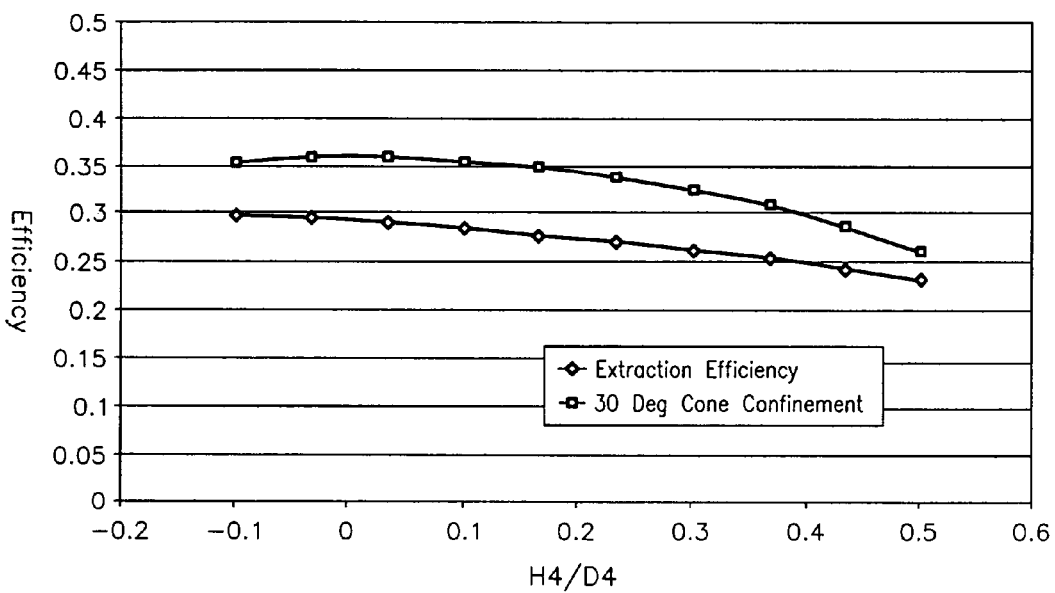
FIG. 7 is a plot showing the effect of the light emitting layer position with respect to the focal plane of the paraboloid (the focal plane being defined as the horizontal plane that intersects the focal point of the paraboloid)
Figure 8:
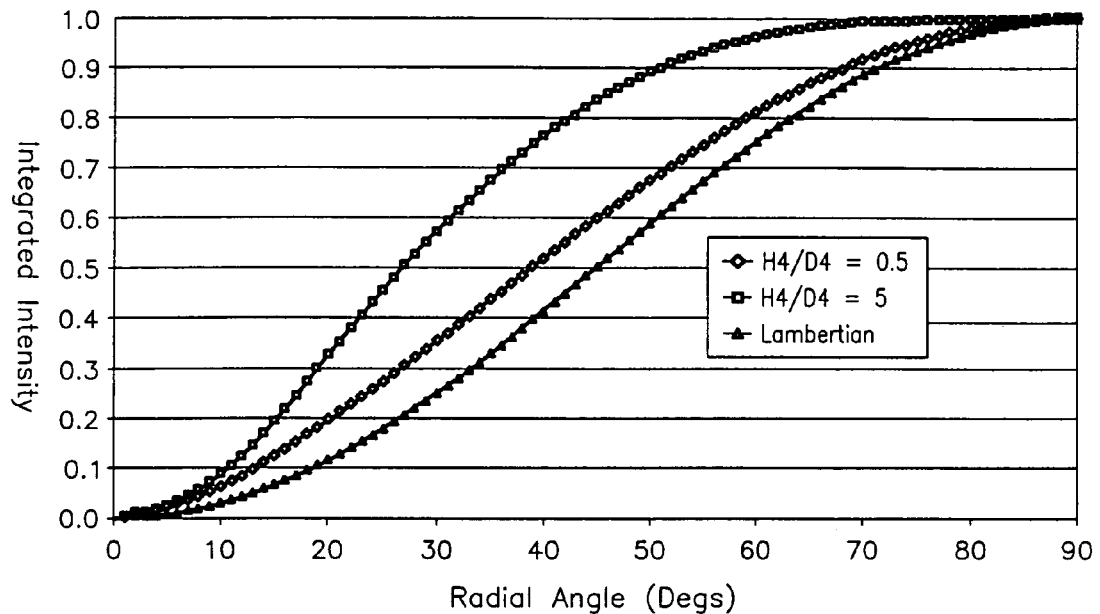
FIG. 8 is a set of beam profiles for a Lambertian emitter and for two parabolic micro-LEDs with different aspect ratios (other parameters the same as in FIG. 5)

Extraction efficiency values as a function of top electrical contact reflectivity are shown in FIG. 6. FIG. 7 shows the effect of the location of the LEL with respect to the focal plane of the paraboloid on the efficiency. This shows that the devices remain effective even when the LEL is slightly offset with respect to the focal plane. FIG. 8 compares the beam properties from paraboloid micro-LEDs with the Lambertian beam properties of standard cuboid shaped chips. In the calculations above, Fresnel losses (due to partial reflection) at the interfaces have been ignored. Such losses can be kept at a minimum by coating the bottom surface with an anti-reflection coating.

Figure 9:
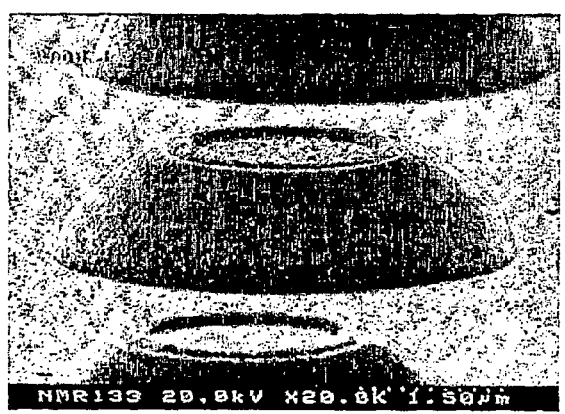
FIG. 9 is a photograph of micro-LEDs, fabricated on GaN/sapphire material.

A photograph of some fabricated micro-LEDs is shown in FIG. 9.

The micro-LEDs allow potentially almost 100% light extraction, provided that the semiconductor material and the (optional) substrate are transparent at the emission wavelength of the LED. A higher light extraction efficiency means less heat dissipation, which in turn allows for a higher operating current, thus further increasing the possible light output from a single device. This will become an important feature once the internal quantum efficiency in a material comes close to 100%, as the light output starts then to rise much faster than linearly with EE. An important feature of each micro-LED is that, because of the shape of the mesa, there is nearly total internal reflection from the mesa walls, causing almost all light to exit at the bottom. This has been achieved without need for fabricating a reflector around the mesa, the internal reflection being achieved because of the shape.

The invention also allows for large single chip dimensions, without sacrificing extraction efficiency. In present LED chips, light extraction through the sides of the chip becomes less effective when the chip area is increased. This limits practical GaN/sapphire chip areas to about 2 mm×2 mm.

A 60-Watt incandescent bulb emits about 1,000 lumens. A car headlight requires about 1,800 lumens. The present invention may provide these light output levels with a single GaN based LED chip.

The light rays generally have a short trajectory within the semiconductor, thus minimising absorption.

The reflections of rays incident on the parabolic sidewalls are mainly at angles greater than the critical angle and therefore virtually loss-less. The majority of the rays that hit the top electrical contact hit it only once.

The emerging light beam can be highly directional (see FIG. 8).

The directional nature of the beam is useful for coupling light into a plastic optical fibre (POF) for example in data communications applications. Coupling of light from an LED into a multi mode fibre may also become a practical possibility. The directionality can be enhanced by increasing the H4/D4 ratio (see FIG. 7), and further increased by decreasing the D1/D2 ratio. The fabrication process can be used to control both these ratios.

The emitted light from each individual LED element is highly contained, and very little light spreads sideways. This is good for micro-LED displays where light ought to emerge from only one pixel and should not spread to neighbouring pixels.

By introducing oblong micro-LED shapes (see FIG. 3), it is possible to obtain a light beam that has an oblong far-field pattern. This is useful for some viewing applications, for example, some traffic warning signs and displays.

The arrangement is compatible with flip-chip bonding techniques, which themselves allow for higher operating currents through improved heat sinking. When combined, the parabolic emitters will allow higher light-outputs from a single LED.

The fabrication technique described below is very simple, and we believe is a major step towards achieving LEDs for highly efficient solid-state lighting.

We also expect increased switching speeds on these devices, because of the higher current densities that can be sent through the devices. The distributed nature of the junctions eliminates areas of low current density (which are slower). The same distributed and three-dimensional nature (which can be used to extract heat from the sides of the mesas) also allows better heat sinking, which in turn allows for higher current densities (thus further increasing the device speed).

The design and fabrication technique are suitable for all semiconductor materials systems where the light can be extracted through a transparent bottom. Examples of such systems are: GaN/sapphire, GaN/SiC, InGaAs/GaAs, and InGaAsP/InP. The invention applies to either p-type doped semiconductor above the LEL, and n-type doped semiconductor below the LEL, or with n-type doped semiconductor above the LEL, and p-type doped semiconductor below the LEL.

Referring now to FIGS. 10(a) to 10(h) the fabrication of the micro-LEDs is now described. The labels used are:

1. (optional) substrate
2. semiconductor material
3. focal plane of a paraboloid
4. light emitting layer (LEL). Cross-sectional area of the mesa at the level of the LEL is "$A_c$"
5. electrically insulating layer
6. top electrical contact to the semiconductor
7. bottom electrical contact to the semiconductor
8. bottom part of a multi-layer etch mask, consisting in this case of pre-exposed resist
9. top part of a multi-layer etch mask, consisting in this case of photo resist
10. micro-LED outline Steps 1,2 (FIG. 10(a)): Perform lithography on a dual layer resist. The bottom layer is pre-exposed, and can be further developed later on in the process. The bottom layer can also be another sacrificial layer that can be etched later on to create an undercut profile for selective lift-off of part of the insulating layer.

Figure 10A:
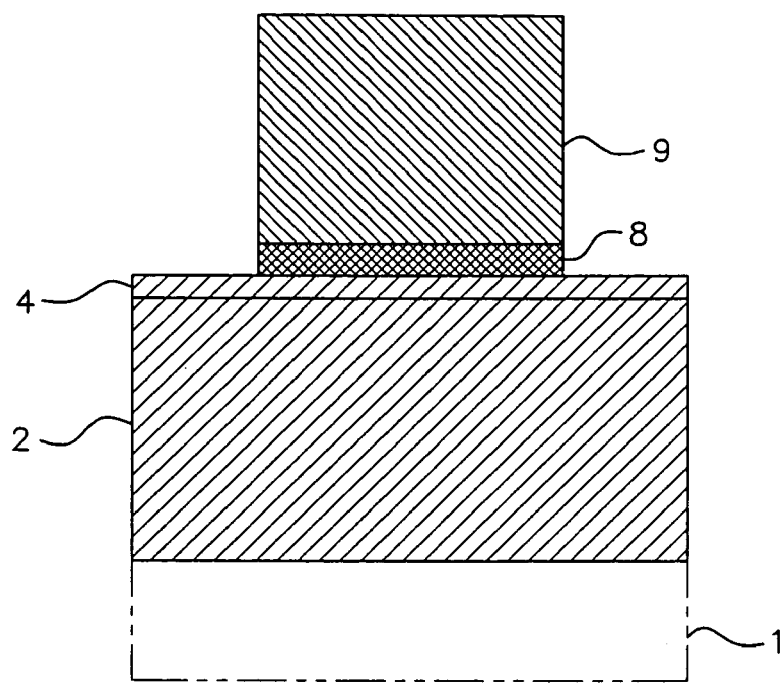
Figure 10B:
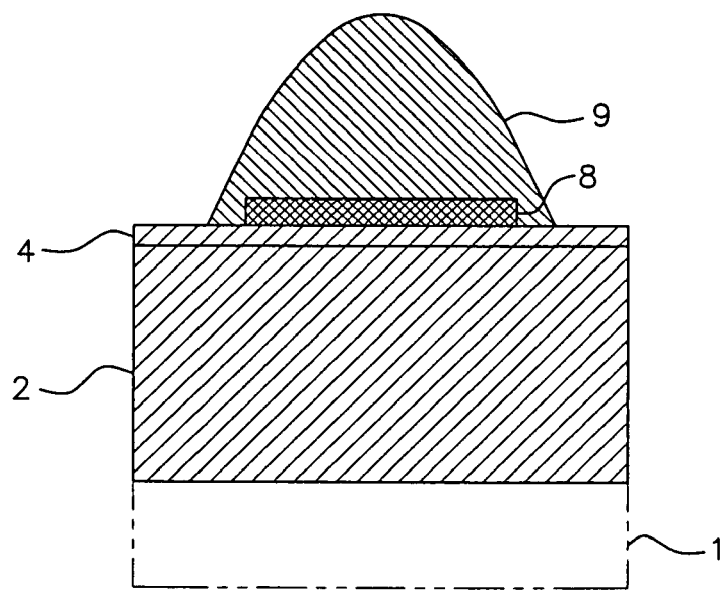

Step 3 (FIG. 10(b)): The multi-layer is reflowed to the desired shape at a specific time and temperature, to create in the next step a near-parabolic profile in the semiconductor.

Figure 10C:
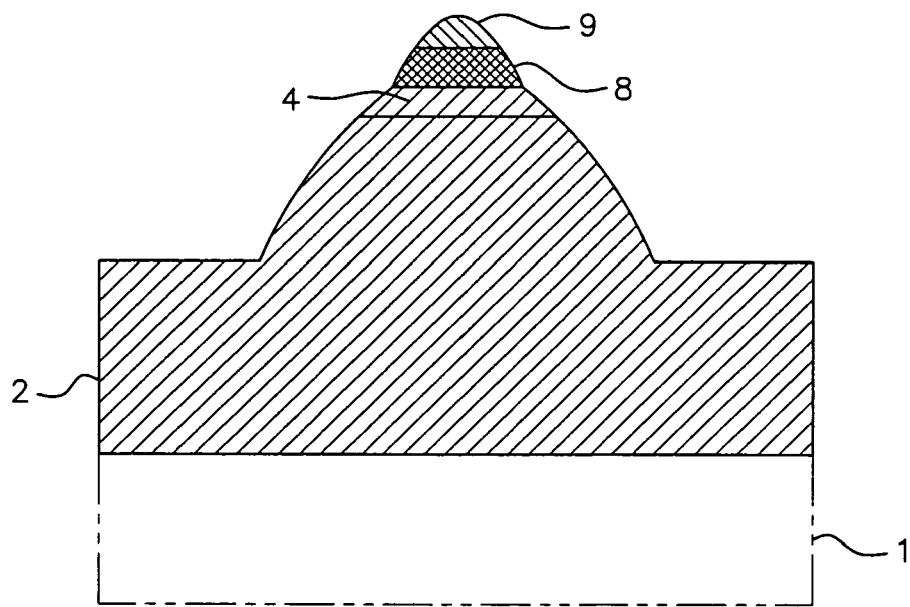

Step 4 (FIG. 10(c)): Dry etching, e.g. by ICP or RIE to transfer the desired shape into the semiconductor.

Figure 10D:
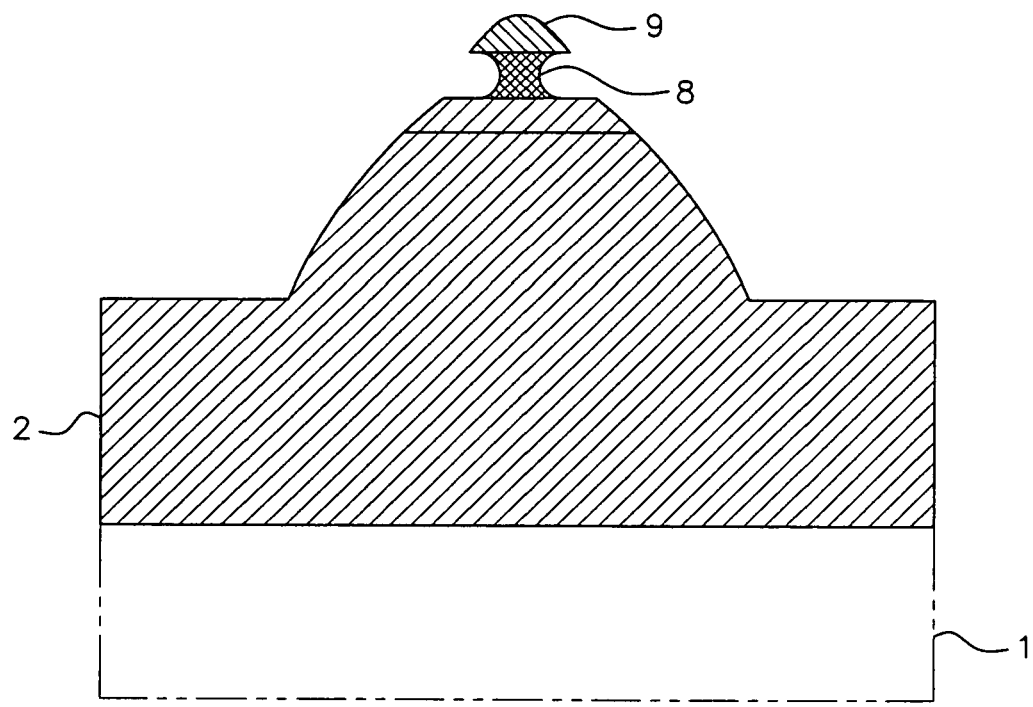

Step 5 (FIG. 10(d)) (Optional): An oxygen plasma step to reduce the size of the multi-layer mound. This will allow for a top electrical contact that is smaller than the top diameter of the mesa, i.e. (D1/D2)<1.

Step 6 (FIG. 10(d)): Further develop the bottom layer to create an overhang profile in the two-layer resist. This is to facilitate the lift-off of part of the insulating coating, to make place for the top electrical contact.

Figure 10E:
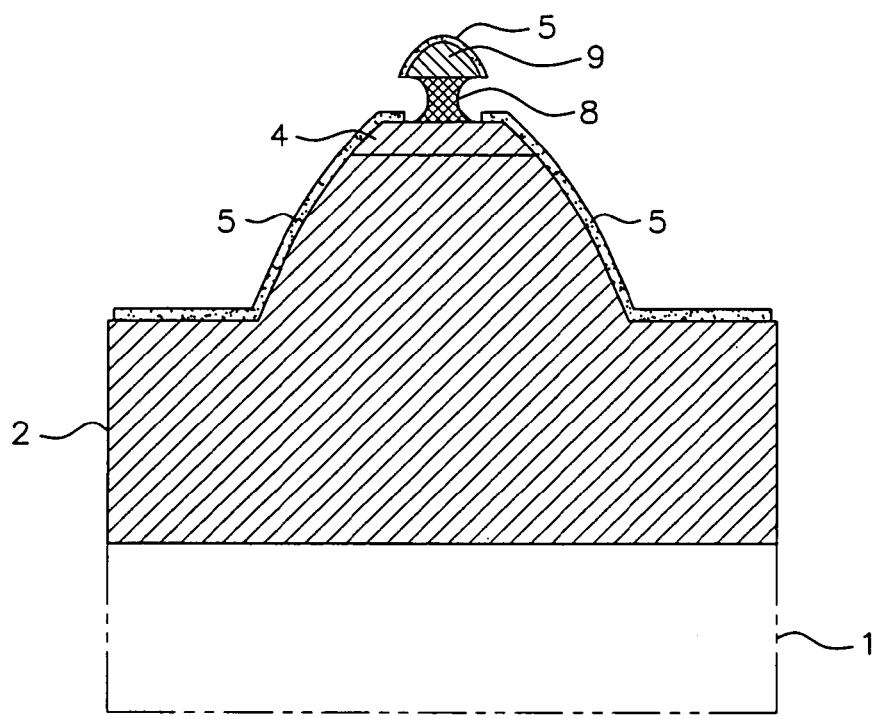

Step 7 (FIG. 10(e)): An insulating coating is deposited over the mesas.

Figure 10F:
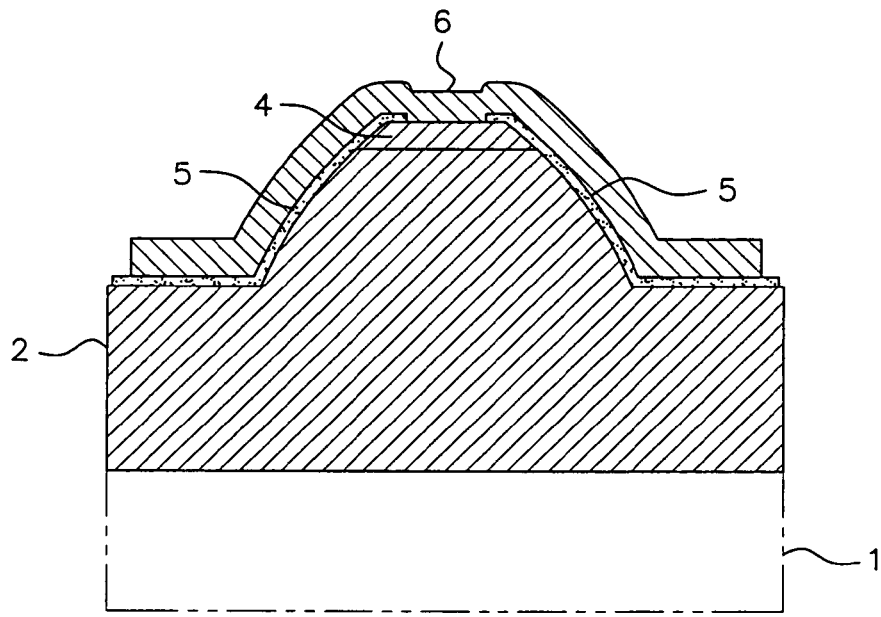

Step 8 (FIG. 10(f)): The remaining resist and the unwanted insulator coating are removed. This is being facilitated by the resist undercut generated in step 6.

Step 9: An electrical contact layer is deposited over the entire insulator coating. At the centre of each mesa this layer makes contact with the semiconductor, providing the electrical contact to the top of the semiconductor mesas.

Step 10: Bottom contact deposition and patterning. This provides the electrical contacts to the semiconductor bottom. The top contact can be either to p-type or to n-type semiconductor.

Figure 11:
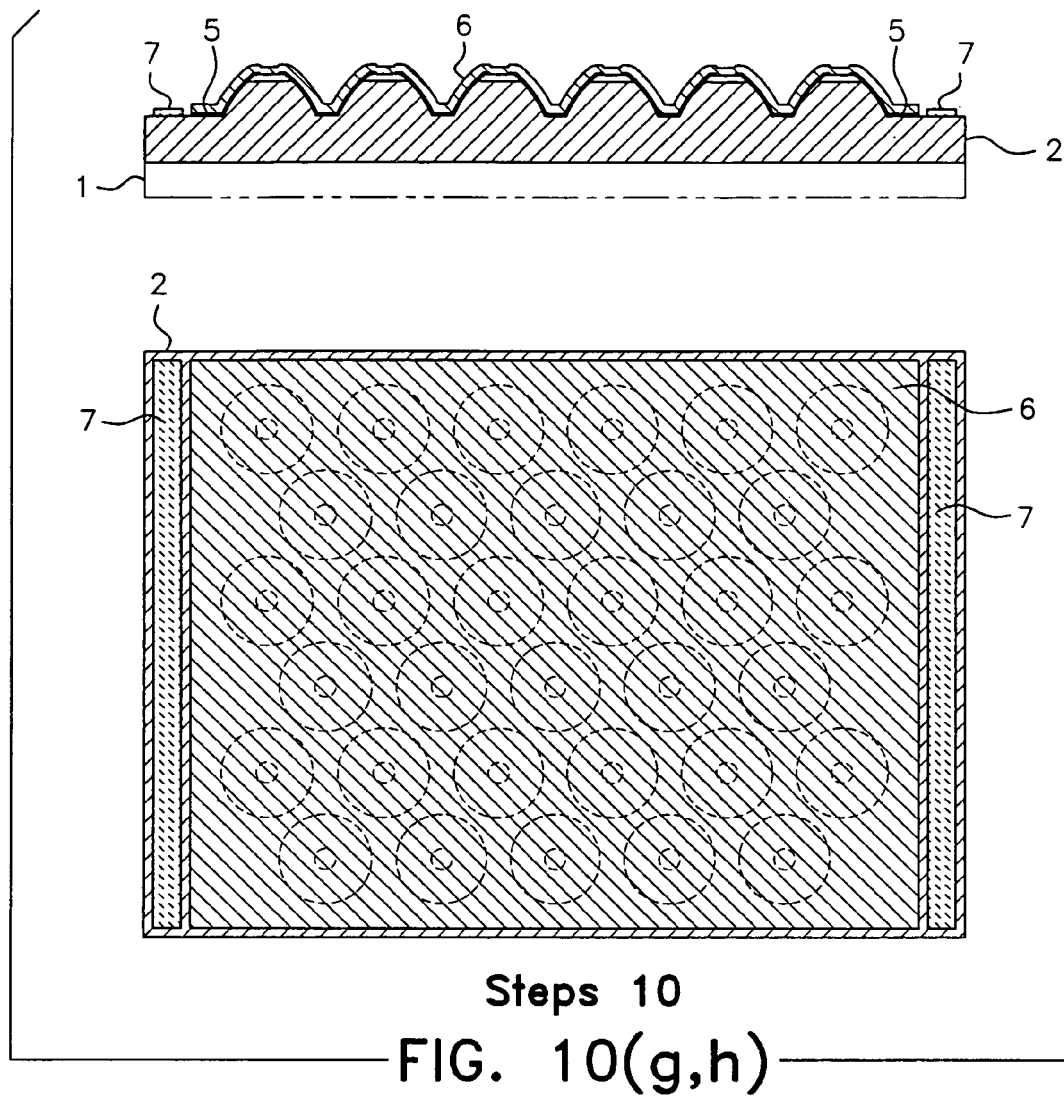
FIG. 11 is a photograph showing light emission from a cluster of fabricated micro-LEDs on GaN/sapphire, as observed through the transparent sapphire substrate.
Figure 11:
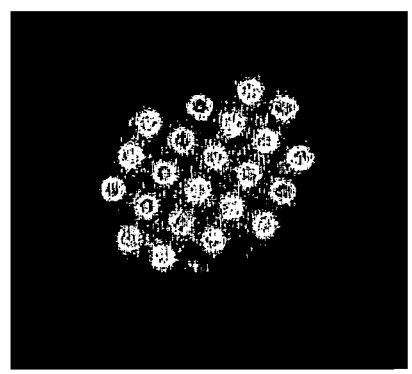
Figure 12:
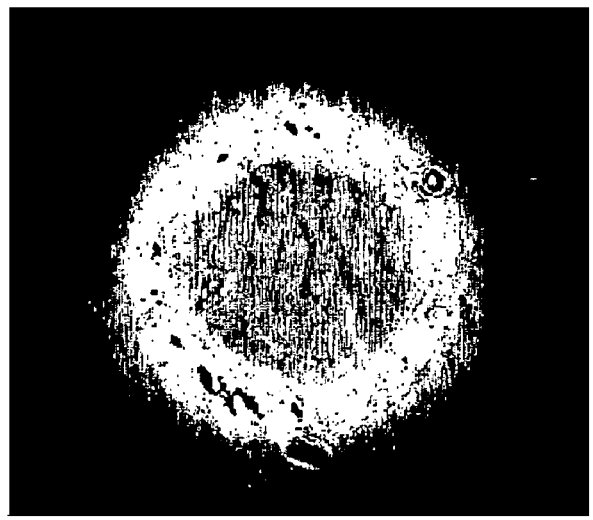
FIG. 12 is a plot of emitted intensity versus position for a single LED element (near field)

FIG. 11 is a photograph showing light emission from a cluster of fabricated micro-LEDs on GaN, as observed through the transparent sapphire substrate (near field). It shows the clear contribution to the light output from the near parabolic side surfaces. FIG. 12 is a plot of emitted intensity versus position for a single such LED element.

Figure 13:
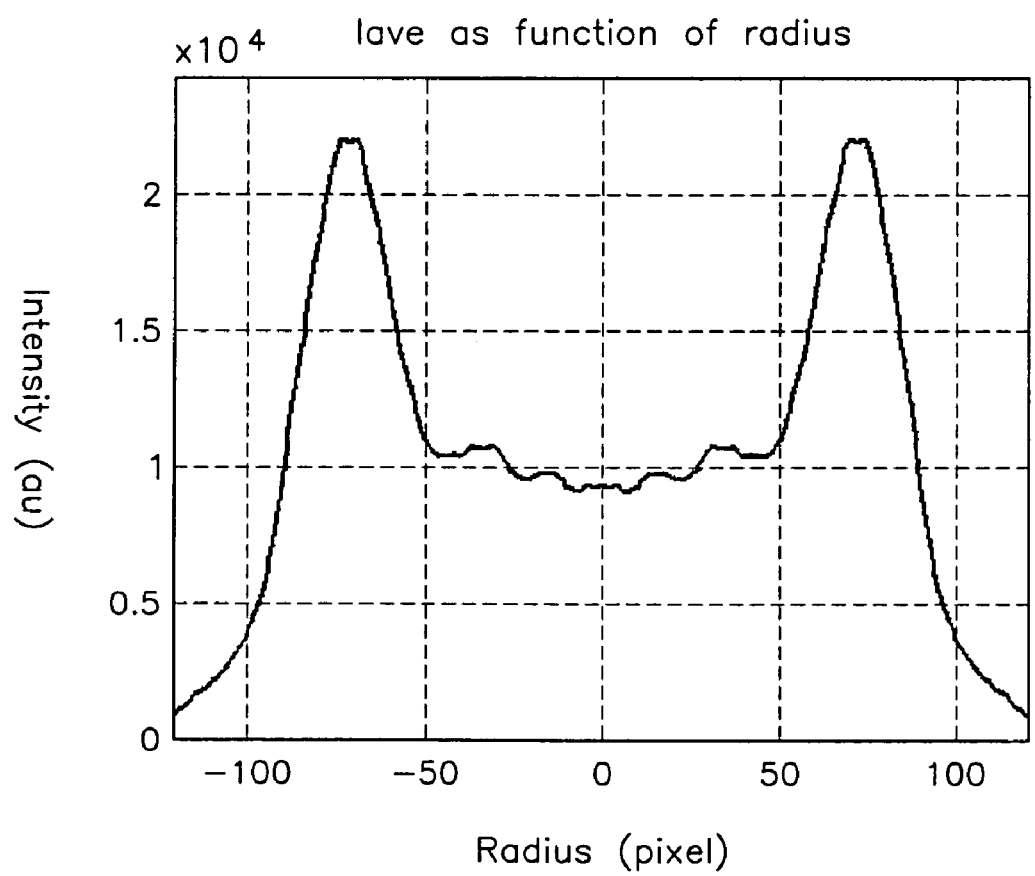
FIG. 13 is a plot of light intensity versus position, on a line across a single micro-LED element, as shown in FIG. 12.

FIG. 13 shows the intensity as a function of position on a line that intersects the centre of the micro-LED element. The H3/D3 ratio for the elements shown in FIGS. 11-13 is approximately 0.5. In this example the wafer was sapphire/n-GaN/InGaN multiple quantum well region/p-GaN. The top contact was Ni/Au. The insulating coating was evaporated $SiO_2$. The bottom contact was Ti/Al. The EE through the bottom surface increased by about a factor 3 on these devices, due to the surface shaping.

It will be appreciated that the invention provides an LED chip with improved EE and directionality, and a simple and effective fabrication method.

The invention is not limited to the embodiments described but may be varied in construction and detail. For example, the active layer could be of any semiconductor material of type IV (e.g. Si, Ge, SiGe), type III-V (e.g. InGaAs, InGaAsP, InGaN, AlInGaN), or type II-IV material (e.g. ZnO, ZnCdSeTe). Also, the light in the active layer may be generated by inter-sub-band transitions. The active layer may be of quantum dot material. Further, the active layer may contain Sb. Further the device may be a photodiode or a photodiode array, in which the active layer detects light.

The invention claimed is:

1. An optical device comprising
a semiconductor diode having an active layer enclosed in a semiconductor structure mesa, in which:
the mesa has a truncated top, on a side opposed to a light transmitting or receiving face;
the mesa has an aspect ratio $((H3) \times (H3)/A_c)$ greater than 0.5, in which $A_c$ is the cross-sectional area of the mesa at the level of the active layer and H3 is a height of the mesa; and
side walls of the mesa intersect the active layer at an angle $\alpha=45°$ (+/−20°) along a substantial part of a perimeter of the active layer, the mesa having a near-parabolic shape to form a reflective enclosure for light generated or detected within the device.

2. The optical device as claimed in claim 1, wherein the mesa cross sectional area $(A_c)$ at the level of the active layer is less than 100 µm².

3. The optical device as claimed in claim 1, wherein the mesa has an aspect ratio $((H3) \times (H3)/A_c)$ greater than 3.

4. The optical device as claimed in claim 1, wherein the mesa has an aspect ratio $((H3) \times (H3)/A_c)$ greater than 8.

5. The optical device as claimed in claim 1, further comprising an electrical contact on the truncated top.

6. The optical device as claimed in claim 5, wherein the electrical contact occupies less than 16% of the area of the truncated top.

7. The optical device as claimed in claim 1, wherein the mesa side walls are curved, the side wall angle α increasing continuously from the active layer towards the transmitting or receiving face.

8. The optical device as claimed in claim 1, wherein the cross sectional area $(A_c)$ of the mesa is rectangular in shape, the length being more than twice the width.

9. The optical device as claimed in claim 1, wherein the active layer is of InGaN material.

10. The optical device as claimed in claim 1, wherein the active layer is of InGaAs material.

11. The optical device as claimed in claim 1, wherein the active layer is of InGaAsP material.

12. The optical device as claimed in claim 1, wherein the active layer is of ZnCdSeTe material.

13. The optical device as claimed in claim 1, wherein the height (H3) of the mesa is greater than 5 µm.

14. The optical device as claimed in claim 1, wherein the active layer is an emitting layer whereby the device is an LED.

15. The optical device as claimed in claim 1, wherein the active layer is a detecting layer, whereby the device is a photodiode.

16. The optical device as claimed in claim 1, wherein the device comprises an array of semiconductor diodes.

17. The optical device as claimed in claim 16, wherein the array comprises conductors so that individual diodes or diode clusters are individually addressable, thus forming an addressable LED or PD array.

18. The optical device as claimed in claim 16, wherein the device area covered with diode mesas is greater than 10 mm², and wherein more than 80% of all extracted light is extracted through a back surface, whereby the device is scalable and suitable for high light outputs from a single array-chip.

19. The optical device as claimed in claim 16, wherein the device area covered with diode mesas is greater than 100 mm², and wherein more than 80% of all extracted light is extracted through a back surface, whereby the device is scalable and suitable for high light outputs from a single array-chip; and wherein the area covered with diode mesas is greater than 100 mm².

20. The optical device as claimed in claim 16, wherein the array is configured as a flip-chip, mounted on a heat sink.

* * * * *